United States Patent
Weiss et al.

(10) Patent No.: US 12,504,697 B2
(45) Date of Patent: Dec. 23, 2025

(54) SINGLE GRAB PUPIL LANDSCAPE VIA BROADBAND ILLUMINATION

(71) Applicant: KLA Corporation, Milpitas, CA (US)

(72) Inventors: Yaniv Weiss, Tel-Aviv (IL); Yuval Lubashevsky, Haifa (IL); Itay Gdor, Tel-Aviv (IL); Vladimir Levinski, Migdal HaEmek (IL); Alon Alexander Volfman, Tel-Aviv (IL)

(73) Assignee: KLA Corporation, Milpitas, CA (US)

( * ) Notice: Subject to any disclaimer, the term of this patent is extended or adjusted under 35 U.S.C. 154(b) by 109 days.

(21) Appl. No.: 18/370,136

(22) Filed: Sep. 19, 2023

(65) Prior Publication Data
US 2024/0402615 A1   Dec. 5, 2024

Related U.S. Application Data

(60) Provisional application No. 63/470,737, filed on Jun. 2, 2023.

(51) Int. Cl.
*G03F 7/00* (2006.01)
*G01N 21/88* (2006.01)
(Continued)

(52) U.S. Cl.
CPC ..... *G03F 7/70633* (2013.01); *G01N 21/8806* (2013.01); *G01N 21/9501* (2013.01);
(Continued)

(58) Field of Classification Search
CPC .......... G01N 21/8806; G01N 21/9501; G01N 21/956; G03F 7/70633; G03F 7/706831; H04N 23/10
(Continued)

(56) References Cited

U.S. PATENT DOCUMENTS 10,197,389 B2   2/2019   Levinski et al.
10,824,079 B2   11/2020  Lubashevsky et al.
(Continued)

FOREIGN PATENT DOCUMENTS

KR   1020170088403 A   8/2017
WO      2022253501 A1   12/2022

OTHER PUBLICATIONS

Korean Intellectual Property Office, International Search Report and Written Opinion received in International Application No. PCT/US2024/028076, Aug. 26, 2024, 7 pages.
(Continued)

*Primary Examiner* — Tri T Ton
(74) *Attorney, Agent, or Firm* — Suiter Swantz IP

(57) ABSTRACT

A method for overlay metrology may include generating broadband illumination beams and directing the broadband illumination beams to an overlay target on a sample, where the overlay target may include cells having periodic features formed as overlapping grating structures. The method may include generating diffracted light using the periodic features of the overlay target, where the periodic features may act as a diffraction grating to generate diffracted light by separating the broadband illumination beam into a plurality of wavelengths. The method may include generating pupil images of cells of the overlay target, where a distribution of light in the pupil plane may include first-order diffraction lobes, where spectra of the first-order diffraction lobes may be spatially dispersed in the pupil plane. The method may include generating an overlay measurement based on portions of the pupil images corresponding to selected wavelengths of the spectra of the first-order diffraction lobes.

20 Claims, 10 Drawing Sheets

(51) Int. Cl.
*G01N 21/95* (2006.01)
*G01N 21/956* (2006.01)
*H04N 23/10* (2023.01)

(52) U.S. Cl.
CPC ..... *G01N 21/956* (2013.01); *G03F 7/706831* (2023.05); *H04N 23/10* (2023.01)

(58) Field of Classification Search
USPC .......................................................... 356/300
See application file for complete search history.

(56) References Cited

U.S. PATENT DOCUMENTS

| | | | |
|---|---|---|---|
| 11,073,768 | B2 | 7/2021 | Hill et al. |
| 2013/0278942 | A1 | 10/2013 | Jeong et al. |
| 2020/0192230 | A1 | 6/2020 | Sokolov et al. |
| 2021/0364279 | A1 | 11/2021 | Manassen et al. |
| 2021/0364935 | A1 | 11/2021 | Gdor et al. |
| 2022/0357674 | A1* | 11/2022 | Hill .................. G01B 11/26 |
| 2023/0328351 | A1* | 10/2023 | Vaknin ............ G03F 7/706851 |

OTHER PUBLICATIONS

Adel et al., "Diffraction order control in overlay metrology: a review of the roadmap options," Proc. SPIE. 6922, Metrology, Inspection, and Process Control for Microlithography XXII, Apr. 2008, 20 pages.

Katz et al., "Optical overlay metrology trends in advanced nodes," Proc. SPIE 12053, Metrology, Inspection, and Process Control XXXVI, May 26, 2022, 19 pages.

Kim et al., "Enhancement of Overlay Metrology Accuracy by Multi-Wavelength Scatterometry with Rotated Quadrupole Illumination," Metrology, Inspection, and Process Control XXXVII, May 24, 2023, 5 pages.

* cited by examiner

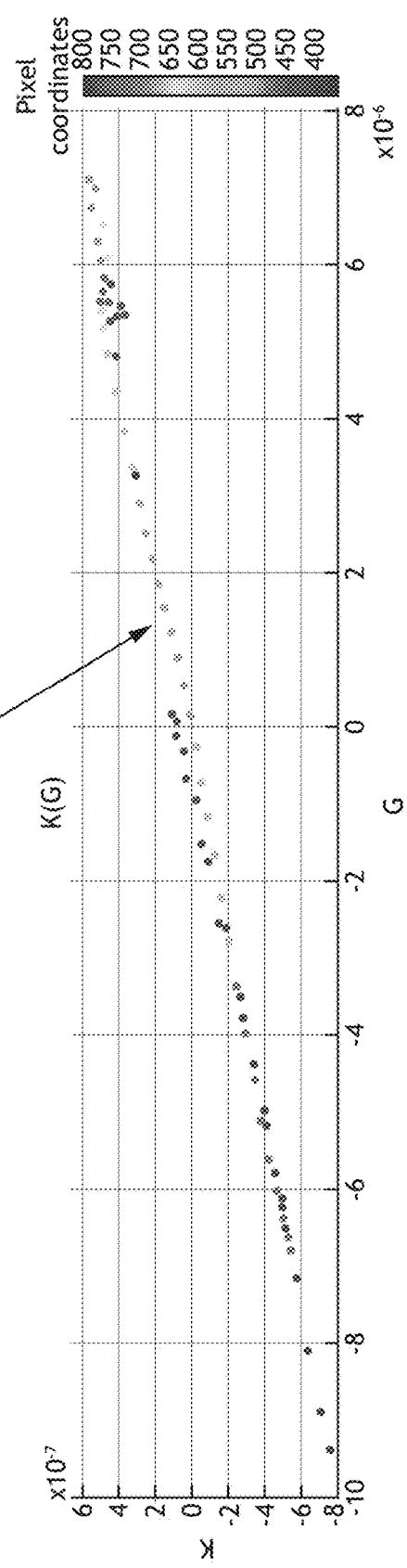

SINGLE GRAB PUPIL LANDSCAPE VIA BROADBAND ILLUMINATION

CROSS-REFERENCE TO RELATED APPLICATIONS

The present application claims the benefit under 35 U.S.C § 119 (e) of U.S. Provisional Application Ser. No. 63/470,737, filed Jun. 2, 2023, which is incorporated herein by reference in the entirety.

TECHNICAL FIELD

The present disclosure relates generally to overlay metrology and, more particularly, to scatterometry overlay metrology.

BACKGROUND

Overlay metrology generally refers to measurements of the relative alignment of layers on a sample such as, but not limited to, semiconductor devices. An overlay measurement, or a measurement of overlay error, typically refers to a measurement of the misalignment of fabricated features on two or more sample layers. In a general sense, proper alignment of fabricated features on multiple sample layers is necessary for proper functioning of the device.

Demands to decrease feature size and increase feature density are resulting in correspondingly increased demand for accurate and efficient overlay metrology. Metrology systems typically generate metrology data associated with a sample by measuring or otherwise inspecting dedicated metrology targets distributed across the sample.

In typical metrology systems, the measurement is performed with monochromatic light. Finding the optimal wavelength requires many time-consuming, single wavelength measurements. The specific wavelength for the recipe is chosen such that it lies in a "green zone" (i.e., where the overlay slope is low and not sensitive to wavelength changes or focus changes) of the pupil landscape of the metrology target. The landscape itself may vary due to process related reasons, thus pushing the predetermined wavelength of the recipe out of the "green zone." Therefore, it is desirable to provide systems and methods for curing the above deficiencies.

SUMMARY

An overlay metrology system is disclosed, in accordance with one or more embodiments of the present disclosure. In embodiments, the overlay metrology system includes an illumination sub-system. In embodiments, the illumination sub-system includes one or more broadband illumination sources configured to generate one or more broadband illumination beams. In embodiments, the illumination sub-system includes one or more illumination optics configured to direct the one or more broadband illumination beams to an overlay target on a sample when implementing a metrology recipe. In embodiments, the overlay target in accordance with the metrology recipe includes one or more cells having periodic features formed as overlapping grating structures. In embodiments, the overlay metrology system includes a collection sub-system. In embodiments, the collection sub-system includes a detector located at a pupil plane. In embodiments, the detector generates one or more pupil images of the one or more cells of the overlay target based on illumination from the one or more broadband illumination beams. In embodiments, a distribution of light in the pupil plane in accordance with the metrology recipe includes first-order diffraction lobes from the one or more broadband illumination beams, where spectra of the first-order diffraction lobes are spatially dispersed in the pupil plane. In embodiments, the collection sub-system includes one or more collection optics configured to direct at least the first-order diffraction to the detector. In embodiments, the overlay metrology system includes a controller communicatively coupled to the detector. In embodiments, the controller including one or more processors configured to execute program instructions causing the one or more processors to receive the one or more pupil images of the one or more cells from the detector and generate an overlay measurement of the sample based on selected portions of the one or more pupil images corresponding to selected wavelengths of the spectra of the first-order diffraction lobes.

An overlay metrology system is disclosed, in accordance with one or more embodiments of the present disclosure. In embodiments, the overlay metrology system includes a controller communicatively coupled to a detector. In embodiments, the controller including one or more processors is configured to execute program instructions causing the one or more processors to receive the one or more pupil images of one or more cells from the detector. In embodiments, the one or more pupil images are generated using one or more broadband illumination beams from one or more broadband illumination sources. In embodiments, the controller including one or more processors is configured to execute program instructions causing the one or more processors to generate an overlay measurement of a sample based on selected portions of the one or more pupil images corresponding to selected wavelengths of a spectra of the first-order diffraction lobes.

A method is disclosed, in accordance with one or more embodiments of the present disclosure. In embodiments, the method includes generating one or more broadband illumination beams with one or more broadband illumination sources. In embodiments, the method includes directing the generated one or more broadband illumination beams to an overlay target on a sample when implementing a metrology recipe, where the overlay target in accordance with the metrology recipe includes one or more cells having periodic features formed as overlapping grating structures. In embodiments, the method includes generating diffracted light using the periodic features of the overlay target, where the periodic features of the overlay target act as a diffraction grating to generate the diffracted light by separating the broadband illumination beam into a plurality of wavelengths. In embodiments, the method includes generating one or more pupil images of one or more cells of the overlay target using a detector located at a pupil plane based on illumination with the one or more broadband illumination beams, where a distribution of light in the pupil plane in accordance with the metrology recipe includes first-order diffraction lobes, where spectra of the first-order diffraction lobes are spatially dispersed in the pupil plane. In embodiments, the method includes generating an overlay measurement of the sample based on selected portions of the one or more pupil images corresponding to selected wavelengths of the spectra of the first-order diffraction lobes.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 5C is a plot depicting overlay, in accordance with one or more embodiments of the present disclosure.

FIG. 5D is a plot depicting overlay, in accordance with one or more embodiments of the present disclosure.

DETAILED DESCRIPTION

Figure 1A:
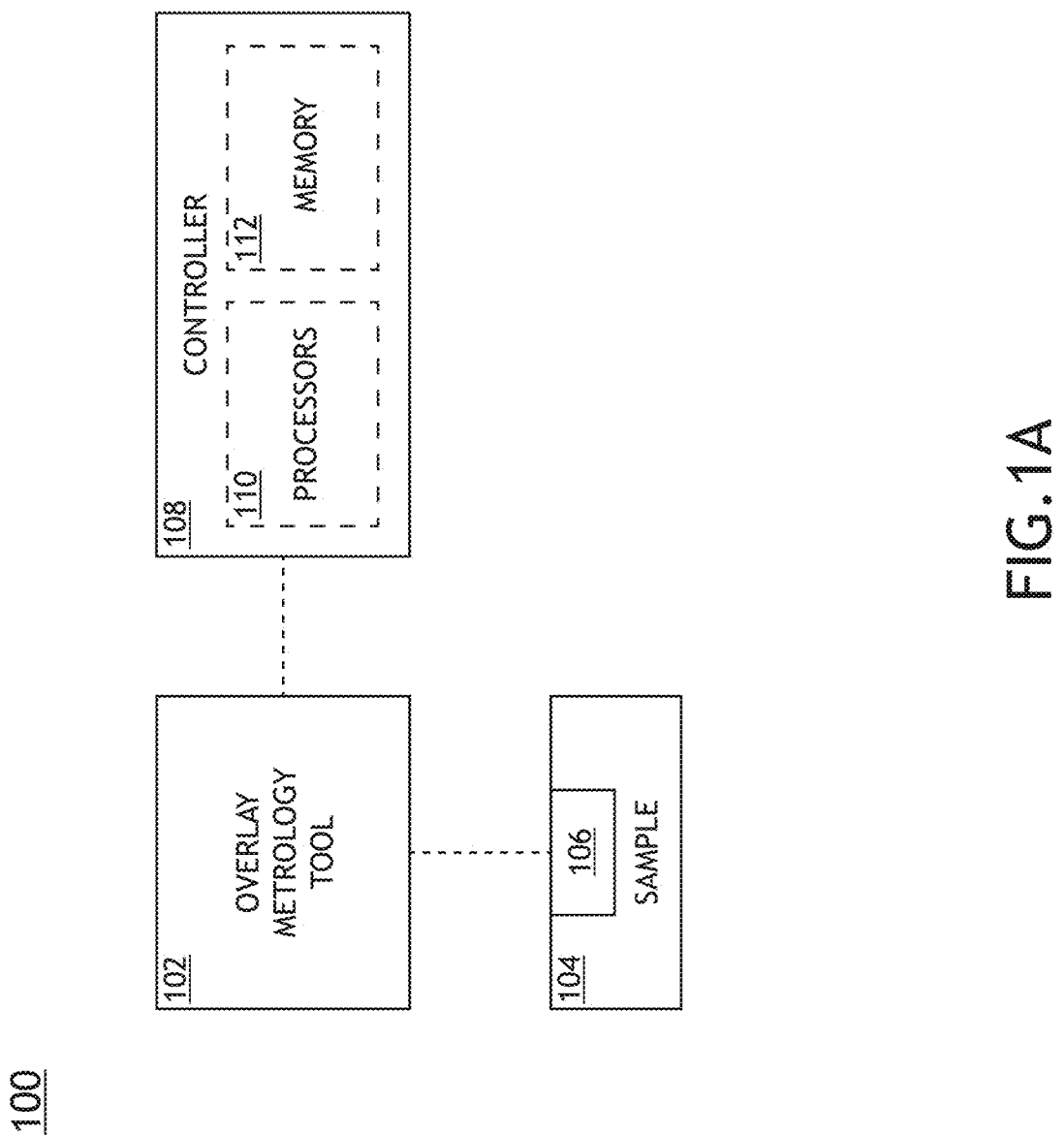
FIG. 1A is a conceptual view of a system for performing scatterometry overlay metrology on overlay targets, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for scatterometry overlay metrology based on broadband illumination, where periodic features on the overlay metrology target act as a diffraction grating to split the broadband illumination beam into the different wavelengths.

For the purposes of the present disclosure, the term "overlay" is generally used to describe relative positions of features on a sample fabricated by two or more lithographic patterning steps, where the term "overlay error" describes a deviation of the features from a nominal arrangement. In this context, an overlay measurement may be expressed as either a measurement of the relative positions or of an overlay error associated with these relative positions. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

While in some applications overlay measurements may be performed directly on features of a fabricated device (e.g., device features), overlay measurements are commonly performed on dedicated overlay targets printed using the same lithography steps as the device features. In this way, the features of an overlay target (e.g., target features) may be specially designed to facilitate overlay measurements. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

For the purposes of the present disclosure, the term "scatterometry metrology" is used to broadly encompass the terms "scatterometry-based metrology" and "diffraction-based metrology" in which a sample having periodic features on one or more sample layers is illuminated with an illumination beam having a limited angular extent and one or more distinct diffraction orders are collected for the measurement. Further, the term "scanning metrology" is used to describe metrology measurements generated when a sample is in motion relative to illumination used for a measurement. In a general sense, scanning metrology may be implemented by moving the sample, the illumination, or both.

It is recognized herein that many scatterometry overlay metrology techniques generally determine overlay by illuminating an overlay target having grating structures in two layers (e.g., grating-over-grating structures), where an overlay measurement is based on asymmetries between positive and negative diffraction orders. For example, various scatterometry techniques are described in U.S. Patent Publication No. 2021/0364279 published on Mar. 11, 2021; U.S. Pat. No. 10,824,079 issued on Nov. 3, 2020; U.S. Pat. No. 10,197,389 issued on Feb. 9, 2019; and Adel, et al., "Diffraction order control in overlay metrology: a review of the roadmap options," Proc. SPIE. 6922, Metrology, Inspection, and Process Control for Microlithography XXII, 692202. (2008); all of which are incorporated herein by reference in their entireties.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

Embodiments of the present disclosure are directed to providing recipes for configuring an overlay metrology tool. An overlay metrology tool is typically configurable according to a recipe including a set of parameters for controlling various aspects of an overlay measurement such as, but not limited to, the illumination of a sample, the collection of light from the sample, or the position of the sample during a measurement. In this way, the overlay metrology tool may be configured to provide a selected type of measurement for one or more overlay target designs of interest. For example, a metrology recipe may include illumination parameters such as, but not limited to, a number of illumination beams, an illumination wavelength, an illumination pupil distribution (e.g., a distribution of illumination angles and associated intensities of illumination at those angles), a polarization of incident illumination, a bandwidth of illumination wavelengths, or a spatial distribution of illumination. By way of another example, a metrology recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, wavelength filters, positions of one or more detectors (e.g., photodetectors) or parameters for controlling the one or more detectors. By way of a further example, a metrology recipe may include various parameters associated with the sample position during a measurement such as, but not limited to, a sample height, a sample orientation, whether a sample is static during a measurement, or whether a sample is in motion during a measurement (along with associated parameters describing the speed, scan pattern, or the like).

As an illustrative example, diffraction-based overlay metrology techniques may illuminate an overlay target having periodic features with illumination at a selected incidence angle, which results in the generation of distinct diffraction orders by the periodic overlay target. Selected diffraction orders may then be collected for use in determining the overlay. Using this approach, the emission angles of the diffraction orders are based on factors such as the periodicity of the metrology target, the wavelength of the illumination, and the angle of illumination. Further, different techniques may utilize different combinations of illumination and collection configurations.

Embodiments of the present disclosure are directed to providing overlay data to one or more process tools. Overlay data from an overlay metrology tool may generally include any output of an overlay metrology tool having sufficient information to determine overlay (or overlay errors) associated with various lithography steps. For example, overlay data may include, but is not required to include, one or more datasets, one or more images, one or more detector readings, or the like. This overlay data may then be used for various purposes including, but not limited to, diagnostic information of the lithography tools or for the generation of process-control correctables. For instance, overlay data for samples in a lot may be used to generate feedback correctables for controlling the lithographic exposure of subsequent samples in the same lot. In another instance, overlay data for samples in a lot may be used to generate feed-forward correctables for controlling lithographic exposures for the same or similar samples in subsequent lithography steps to account for any deviations in the current exposure.

Existing scatterometry overlay measurements are performed using monochromatic light. Finding the optimal wavelength when using monochromatic light requires multiple, time-consuming, single wavelength measurements (i.e., the pupil landscape). In such systems, the specific wavelength for the recipe is chosen such that it lies in a "green zone" of the pupil landscape of the target. However, the landscape itself may vary due to process related reasons, thus pushing the recipe predetermined wavelength out of the green zone.

For purposes of the present disclosure, the term "green zone", "region of stability", and variations thereof may be defined as an area in which a measurement is relatively stable with respect to deviations of process parameters. For example, the "green zone" may be an area where the overlay slope is low and not sensitive to wavelength changes or focus changes.

It is contemplated herein that scatterometry overlay metrology utilizing broadband illumination may provide numerous benefits over traditional monochromatic (e.g., single band) illumination such as, but not limited to, alleviating issues with changing green zones (e.g., the set of wavelengths for which an overlay measurement may be stable) by using a variety of wavelengths to obtain an overlay measurement.

Further, the system and method of the present disclosure allows a rapid (e.g., single grab) acquisition of the full pupil landscape. In this regard, the full pupil landscape may enable local optimization of the overlay measurement and tracking of process variation.

Referring now to FIGS. 1A-6, systems and methods for scatterometry overlay metrology are described in greater detail, in accordance with one or more embodiments of the present disclosure.

FIG. 1A is a conceptual view of an overlay metrology system 100 for performing scatterometry overlay metrology on an overlay target 106, in accordance with one or more embodiments of the present disclosure.

In embodiments, the overlay metrology system 100 includes an overlay metrology tool 102 to acquire overlay signals from overlay targets 106 based on any number of overlay recipes. For example, the overlay metrology tool 102 may direct illumination to a sample 104 and may further collect light or other radiation emanating from the sample 104 to generate an overlay signal suitable for the determination of overlay of two or more sample layers. The overlay metrology tool 102 may be any type of overlay metrology tool known in the art suitable for generating overlay signals suitable for determining overlay associated with overlay targets 106 on a sample 104. The overlay metrology tool 102 may selectively operate in an imaging mode or a non-imaging mode. For example, in an imaging mode, individual overlay target elements may be resolvable within the illuminated spot on the sample 104 (e.g., as part of a bright-field image, a dark-field image, or the like). By way of another example, the overlay metrology tool 102 may operate as a scatterometry-based overlay metrology tool in which radiation from the sample 104 is analyzed at a pupil plane to characterize the angular distribution of radiation from the sample 104 (e.g., associated with scattering and/or diffraction of radiation by the sample 104).

Further, the overlay metrology tool 102 may be configurable to generate overlay signals based on any number of recipes defining measurement parameters for acquiring an overlay signal suitable for determining overlay of an overlay target 106. For example, a recipe of an overlay metrology tool 102 may include, but is not limited to, an illumination wavelength, a detected wavelength of light emanating from the sample 104, a spot size or shape of illumination on the sample 104, an angle of incident illumination, a polarization of incident illumination, a polarization of collected light, a position of a beam of incident illumination on an overlay target 106, a position of an overlay target 104 in the focal volume of the overlay metrology tool 102, or the like.

Figure 1B:
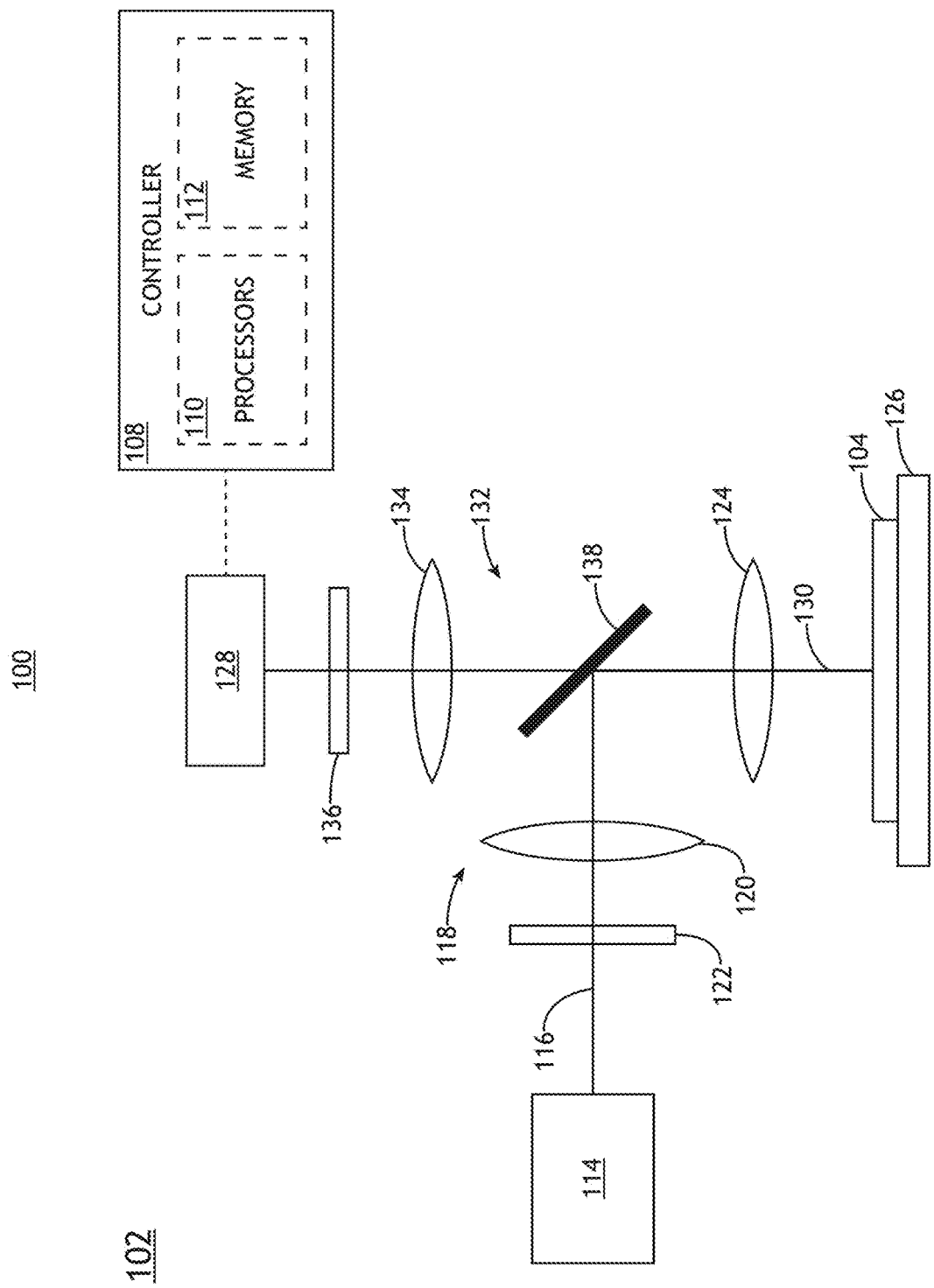
FIG. 1B is a schematic view of the overlay metrology tool, in accordance with one or more embodiments of the present disclosure.

FIG. 1B is a conceptual view illustrating the overlay metrology tool 102 of the overlay metrology system 100, in accordance with one or more embodiments of the present disclosure.

In embodiments, the overlay metrology tool 102 includes an illumination sub-system including an illumination source 114 configured to generate at least one illumination beam 116 and one or more illumination optics 122. For example, the illumination sub-system may include one or more broadband illumination sources 114 configured to generate one or more broadband illumination beams 116. In this regard, the overlay metrology tool 102 may include one or more apertures at an illumination pupil plane to divide illumination from the illumination source 114 into one or more illumination beams 116 or illumination lobes. In this regard, the overlay metrology tool 102 may provide dipole illumination, quadrature illumination, or the like. Further, the spatial profile of the one or more illumination beams 116 on the sample 104 may be controlled by a field-plane stop to have any selected spatial profile.

The illumination source 114 may include any type of illumination source suitable for providing at least one broadband illumination beam 116. In embodiments, the illumination source 114 is a laser source. For example, the illumination source 114 may include a broadband laser source.

In embodiments, the overlay metrology tool 102 directs the illumination beam 116 to the sample 104 via an illumination pathway 118. The illumination pathway 118 may include one or more optical components suitable for modifying and/or conditioning the illumination beam 116 as well as directing the illumination beam 116 to the sample 104. In embodiments, the illumination pathway 118 includes one or more illumination-pathway lenses 120 (e.g., to collimate the illumination beam 116, to relay pupil and/or field planes, or the like). In embodiments, the illumination pathway 118 includes one or more illumination-pathway optics 122 to shape or otherwise control the illumination beam 116. For example, the illumination-pathway optics 122 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In embodiments, the overlay metrology tool 102 includes an objective lens 124 to focus the illumination beam 116 onto the sample 104 (e.g., an overlay target 106 with overlay target features located on two or more layers of the sample 104). In embodiments, the sample 104 is disposed on a sample stage 126 suitable for securing the sample 104 and further configured to position the sample 104 with respect to the illumination beam 116.

In embodiments, the overlay metrology tool 102 includes one or more detectors 128 configured to capture light emanating from the sample 104 (e.g., an overlay target 106 on the sample 104) (e.g., collected light 130) through a collection pathway 132. The collection pathway 132 may include one or more optical elements suitable for modifying and/or conditioning the collected light 130 from the sample 104. In embodiments, the collection pathway 132 includes one or more collection-pathway lenses 134 (e.g., to collimate the illumination beam 116, to relay pupil and/or field planes, or the like), which may include, but is not required to include, the objective lens 124. In embodiments, the collection pathway 132 includes one or more collection-pathway optics 136 to shape or otherwise control the collected light 130. For example, the collection-pathway optics 136 may include, but are not limited to, one or more field stops, one or more pupil stops, one or more polarizers, one or more filters, one or more beams splitters, one or more diffusers, one or more homogenizers, one or more apodizers, one or more beam shapers, or one or more mirrors (e.g., static mirrors, translatable mirrors, scanning mirrors, or the like).

The detector 128 may be located at any selected location within the collection pathway 132. In embodiments, the overlay metrology tool 102 includes the detector 128 at a field plane (e.g., a plane conjugate to the sample 104) to generate an image of the sample 104. In embodiments, the overlay metrology tool 102 includes the detector 128 at a pupil plane (e.g., a diffraction plane) to generate a pupil image. In this regard, the pupil image may correspond to an angular distribution of light from the sample 104 captured by the detector 128. For instance, diffraction orders associated with diffraction of the illumination beams 116 from the sample 104 (e.g., an overlay target on the sample 104) may be imaged or otherwise observed in the pupil plane. In a general sense, the detector 128 may capture any combination of reflected (or transmitted), scattered, or diffracted light from the sample 104.

The overlay metrology tool 102 may generally include any number or type of detectors 128 suitable for capturing light from the sample 104 indicative of overlay. In embodiments, the detector 128 includes one or more detectors 128 suitable for characterizing a static sample. In this regard, the overlay metrology tool 102 may operate in a static mode in which the sample 104 is static during a measurement. For example, a detector 128 may include a two-dimensional pixel array such as, but not limited to, a charge-coupled device (CCD) or a complementary metal-oxide semiconductor (CMOS) device. In this regard, the detector 128 may generate a two-dimensional image (e.g., a field-plane image or a pupil-plan image) in a single measurement.

In embodiments, the detector 128 includes one or more detectors 128 suitable for characterizing a moving sample 104 (e.g., a scanned sample). In this regard, the overlay metrology tool 102 may operate in a scanning mode in which the sample 104 is scanned with respect to a measurement field during a measurement. For example, the detector 128 may include a 2D pixel array with a capture time and/or a refresh rate sufficient to capture one or more images during a scan within selected image tolerances (e.g., image blur, contrast, sharpness, or the like). By way of another example, the detector 128 may include a line-scan detector to continuously generate an image one line of pixels at a time. By way of another example, the detector 128 may include a time-delay integration (TDI) detector. A TDI detector may generate a continuous image of the sample 104 when the motion of the sample 104 is synchronized to charge-transfer clock signals in the TDI detector. In particular, a TDI detector acquires charge from light exposure on columns of pixels and includes clock pulses to transfer charge between adjacent columns of pixels along a scan direction. When the motion of the sample 104 along the scan direction is synchronized to the charge transfer in the TDI detector, charge continuously accumulates during the scan. This process continues until the charge reaches a final column of pixels and is subsequently read out of the detector. In this way, images of the object are accumulated over a longer time frame than would be possible with a simple line scan camera. This relatively longer acquisition time decreases the photon noise level in the image. Further, synchronous motion of the image and charge prevents blurring in the recorded image.

In embodiments, the overlay metrology tool 102 includes a scanning sub-system to scan the sample 104 with respect to the measurement field during a metrology measurement. For example, the sample stage 126 may position and orient the sample 104 within a focal volume of the objective lens 124. In embodiments, the sample stage 126 includes one or more adjustable stages such as, but not limited to, a linear translation stage, a rotational stage, or a tip/tilt stage. In embodiments, though not shown, the scanning sub-system includes one or more beam-scanning optics (e.g., rotatable mirrors, galvanometers, or the like) to scan the illumination beams 116 with respect to the sample 104).

The illumination pathway 118 and the collection pathway 132 of the overlay metrology tool 102 may be oriented in a wide range of configurations suitable for illuminating the sample 104 with the illumination beams 116 and collecting light emanating from the sample 104 in response to the incident illumination beams 116. For example, as illustrated in FIG. 1B, the overlay metrology tool 102 may include a beamsplitter 138 oriented such that a common objective lens 124 may simultaneously direct the illumination beams 116 to the sample 104 and collect light from the sample 104. By way of another example, the illumination pathway 118 and the collection pathway 132 may contain non-overlapping optical paths.

Figure 2:
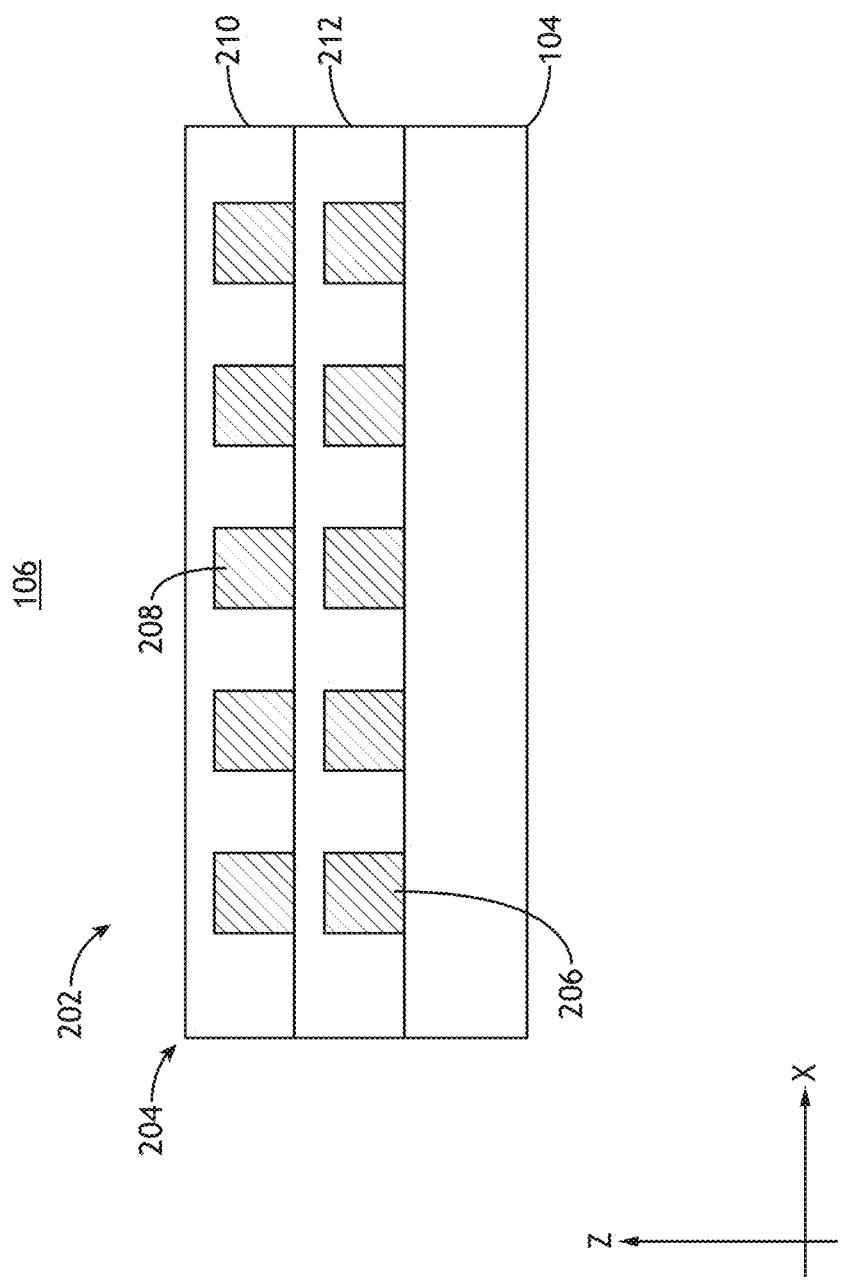
FIG. 2 is a side view of an overlay target suitable for scatterometry overlay measurements in which a cell includes a grating-over-grating structure, in accordance with one or more embodiments of the present disclosure.

FIG. 2 is a side view of an overlay target 106 suitable for scatterometry overlay measurements in which a cell 202 includes a grating-over-grating structure 204, in accordance with one or more embodiments of the present disclosure.

In embodiments, the overlay target 106 includes one or more cells 202 having one or more periodic features 206, 208 formed as overlapping grating structures 204 on the sample 104. For example, the one or more cells 202 may include a first periodic feature 206 on a first layer 210 and a second periodic feature 208 on a second layer 212, where the first periodic feature 206 overlaps with the second periodic feature 208 to form an overlapping grating structure 204 on the sample 104.

In embodiments, the periodic features of the overlay target act as a diffraction grating to generate diffracted light by separating the broadband illumination beams into a plurality of wavelengths. For example, the broadband illumination source 114 may generate one or more broadband illumination beams 116 and the one or more illumination optics 122 may direct the one or more broadband illumination beams 116 to a surface of the sample 104. In this regard, the periodic features 206, 208 of the overlay target 106 on the surface of the sample 104 may separate the one or more broadband illumination beams 116 into a plurality of wavelengths at a plurality of diffraction angles.

The overlay target 106 may generally be formed from any number of cells 202 and any particular cell 202 may include overlapping grating structures 204 with a periodicity along any direction. For example, the overlay target 106 may include multiple cells 202 with grating structures 204 having periodicity along a common direction, where the different cells 202 have different configurations of the periodicities of the associated gratings.

It is to be understood, however, that the overlay target 106 in FIG. 2 and the associated description are provided solely for illustrative purposes and should not be interpreted as limiting. Rather, the overlay target 106 may include any suitable grating-over-grating overlay target design. For example, the overlay target 106 may include any number of cells 202 suitable for measurements along two directions. Further, the cells 202 may be distributed in any pattern or arrangement. For example, metrology target designs suitable for scanning metrology are generally described in U.S. Pat. No. 11,073,768 issued on Jul. 27, 2021, which is incorporated herein by reference in its entirety. In embodiments, the overlay target 106 includes one or more cell groupings distributed along a scanning direction (e.g., a direction of motion of the sample 104), where cells 202 within each particular cell grouping are oriented to have periodic features 206 periodic along a common direction. For instance, a first cell grouping may include one or more cells 202 having periodicities along the X direction and a second cell grouping may include one or more cells 202 having periodicities along the Y direction. In this way, all cells 202 within a particular cell grouping may be imaged at the same time while the sample 104 is scanned with the overlay metrology tool 102. By way of another example, diagonal targets suitable for metrology measurements in orthogonal directions in a single scan are described generally in U.S. Patent Publication No. 2021/0364935 published on Nov. 25, 2021, which is incorporated herein by reference in its entirety.

Figure 3A:
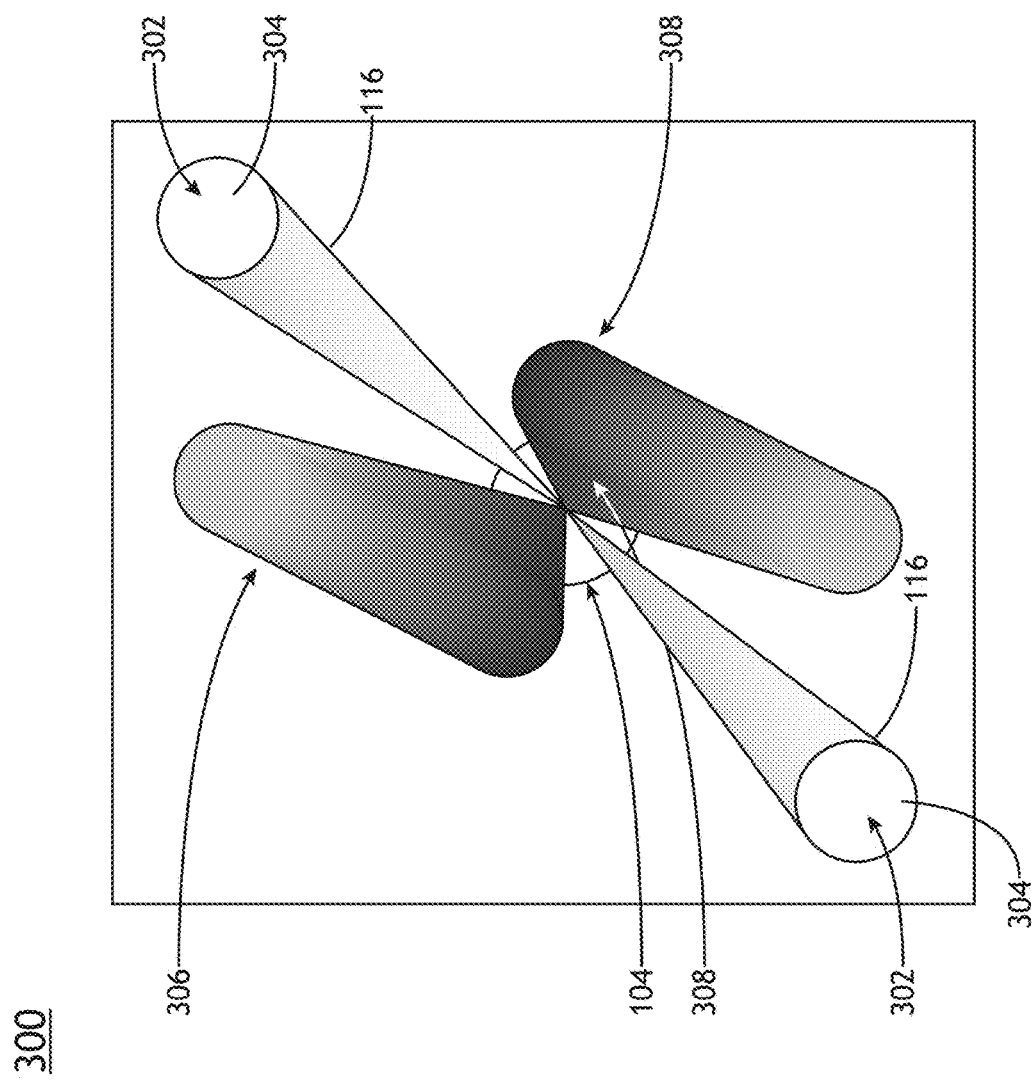
FIG. 3A is a three-dimensional perspective top view of a sample depicting diffraction of a broadband illumination beam, in accordance with one or more embodiments of the present disclosure.
Figure 3B:
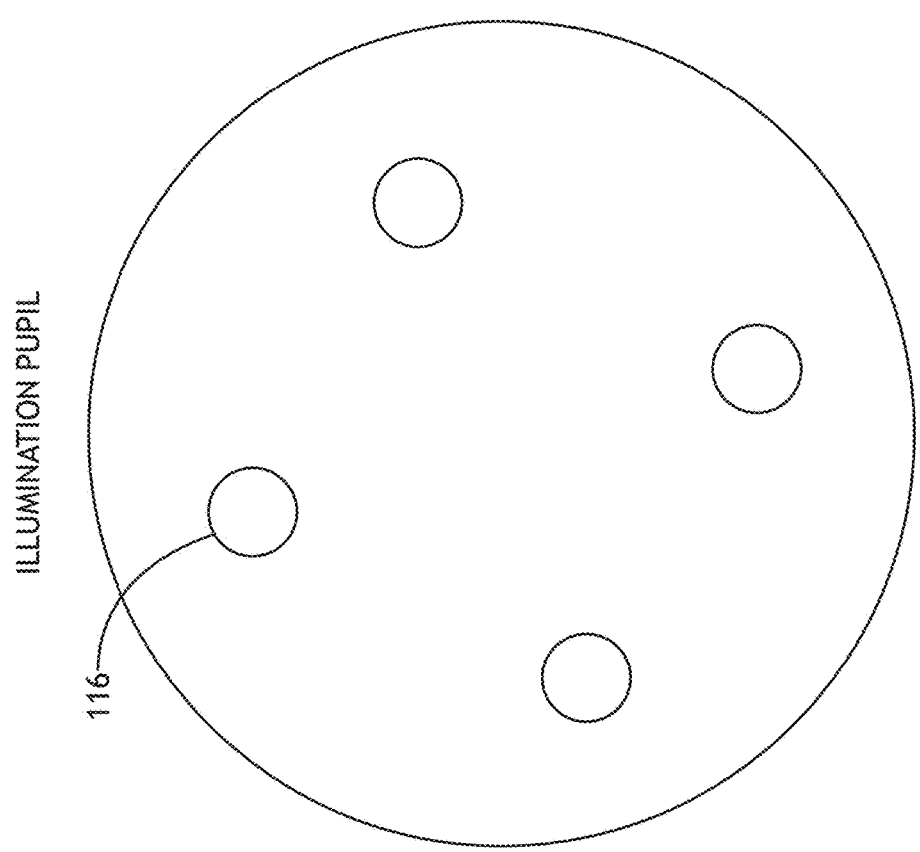
FIG. 3B is a top view of an illumination pupil image of an overlay metrology target illuminated with a broadband illumination beam, in accordance with one or more embodiments of the present disclosure.
Figure 3C:
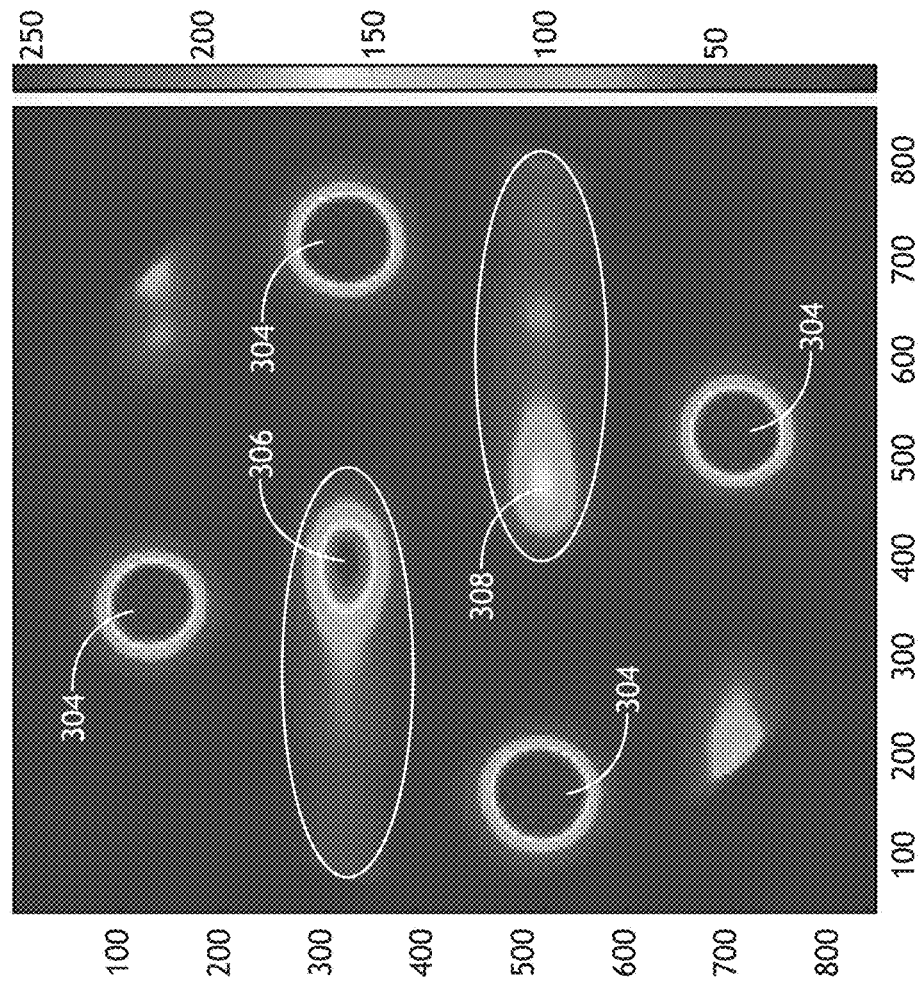
FIG. 3C is a top view of a collection pupil image of an overlay metrology target illuminated with a broadband illumination beam, in accordance with one or more embodiments of the present disclosure.

Referring generally to FIGS. 3A-3C, various non-limiting configurations for the generation and measurement of signals from periodic features 206 in one or more cells 202 of an overlay target 106 are described, in accordance with one or more embodiments of the present disclosure.

As previously discussed herein, the periodic features 206, 208 on the overlay metrology target 106 may act as a diffraction grating to split the broadband illumination beam 116 into different wavelengths. For example, the sample 104 may be illuminated with the one or more illumination beams 116 (e.g., illumination spot 302), where the periodic features 206, 208 generate spatially-dispersed diffraction lobes (e.g., 0-order diffraction lobes 304, +/−1-order diffraction lobes 306, 308) that are also spectrally dispersed.

In embodiments, the illumination sub-system illuminates the overlay target 106 with any number of illumination beams 116 at any angle. For example, the illumination pupil plane may correspond to a pupil plane in the illumination sub-system as illustrated in FIG. 1B.

In embodiments, the one or more detectors 128 may be configured to generate a pupil image of the overlay target 106 when the overlay target 106 is illuminated with the broadband illumination beams 116 from the broadband illumination source 114. For example, a pupil image of the overlay target 106 may be generated when the overlay target 106 is illumination with broadband illumination. For instance, the pupil image may include an illumination spot 302 and one or more diffraction lobes (e.g., 0-order diffraction lobes 304, +/−1-order diffraction lobes 306, 308), where spectra of the +/−1-order diffraction lobes 306, 308 may be spatially dispersed in the pupil plane.

In embodiments, the one or more illumination optics 122 may be configured to direct the broadband illumination beams 116 to the overlay target 106 on a sample 104 when implementing a metrology recipe. For example, the overlay target 106, in accordance with the metrology recipe, may include one or more cells having periodic features formed as overlapping grating structures (e.g., grating-over-grating structures). For instance, the periodic features of the overlay target 106 may act as a diffraction grating to generate diffracted light by separating the broadband illumination beams 116 into a plurality of wavelengths.

In embodiments, the one or more detectors 128 are located at a pupil plane. For example, the one or more detectors 128 may be configured to generate a pupil image 300 of the overlay target 106 when the overlay target 106 is illuminated with the broadband illumination beams 116 from the broadband illumination source 114.

FIG. 3A is a three-dimensional perspective top view of a sample depicting diffraction of a broadband illumination beam, in accordance with one or more embodiments of the present disclosure. FIG. 3B is a top view of an illumination pupil 310 in an illumination pupil plane of the overlay metrology tool 102, in accordance with one or more embodiments of the present disclosure.

Referring to FIG. 3A, in embodiments, the one or more broadband illumination sources 114 may include a dipole illumination source providing illumination beams 116 having opposing azimuth angles in the pupil plane. For example, as shown in FIG. 3A, the illumination pupil 310 may include two illumination beams 116 having opposing azimuth angles in the pupil plane.

Referring to FIG. 3B, in embodiments, the broadband illumination source 114 may include a rotated quadrupole illumination source 114 providing oblique illumination beams 116 along two orthogonal directions in the pupil plane. For example, as shown in FIG. 3B, the illumination pupil 310 may include four illumination beams 116 along two orthogonal directions in the pupil plane.

FIG. 3C is a top view of a collection pupil image 320 of an overlay metrology target 106 illuminated with the four broadband illumination beams 116 depicted in FIG. 3B, in accordance with one or more embodiments of the present disclosure. In particular, FIG. 3C illustrates a non-limiting configuration of diffraction orders of the illumination beam 116 in a collection pupil plane. For example, the collection pupil plane may correspond to a pupil plane in the collection sub-system as illustrated in FIG. 1B. In particular, FIG. 3C illustrates 0-order diffraction 304, −1 order grating diffraction 306, and +1 order grating diffraction 308 distributed along the direction of periodicity of the overlapping grating structures 204 (e.g., the X direction here) in the collection pupil plane. For example, the −1 order grating diffraction 306 and the +1 order grating diffraction 308 may be associated with grating diffraction from first-layer grating 208 and the second-layer grating 212. In this regard, a spectrum of the first-order diffraction lobes 306, 308 may be spatially dispersed in the pupil plane, as shown in FIGS. 3A and 3C.

As previously discussed herein, the system and method of the present disclosure may provide number of benefits. For example, the system and method of the present disclosure may provide a more robust method for employing existing overlay measurement techniques. For instance, the spectrum of first-order diffraction lobes 306, 308 may be spatially dispersed in the pupil plane, such that a single-wavelength overlay measurement may be obtained based on an identified "green zone" that corresponds to the first-order diffraction lobes 306, 308. By way of another example, the system and method of the present disclosure may allow for the use of multi-wavelength techniques. For instance, the spectrum of first-order diffraction lobes 306, 308 may be spatially dispersed in the pupil plane, such that a region of multiple wavelengths within the identified "green zone" may be used to obtain an overlay measurement, as will be discussed further herein and shown in FIGS. 5A-5D.

In embodiments, an overlay measurement of the overlay target 106 may be generated based on selected portions of the pupil images corresponding to selected wavelengths of the spectra of first-order diffraction lobes 306, 308.

To measure the overlay in the x or y direction, two cells with opposite intentional shifts ($\pm f_0$) may be used. In each cell a differential signal ($D_\pm$) is calculated as shown and described by Equation 1 below:

$$D_\pm = S_{+1}(\pm f_0) - S_{-1}(\pm f_0) \qquad (1)$$

where $S_{+1}$ is the positive first diffraction order signal, $S_{-1}$ is the negative first diffraction order signal, $\pm f_0$ is the offset parameter, $G = D_1 - D_2$, and $K = D_1 + D_2$.

The per-pixel overlay (E) is obtained from Equation 2:

$$\epsilon \approx f_0 \frac{D_+ + D_-}{D_+ - D_-} \qquad (2)$$

where the values for the differential signals ($D_\pm$) are obtained using Equation 1.

The slope of the straight line (e.g., the best fit line) may be proportional to overlay, as shown and described by Equations 3-4 below:

$$K \approx \frac{\epsilon}{f_0} G \qquad (3)$$

$$OVL = f_0 \frac{K}{G} \qquad (4)$$

It is contemplated herein that metrology data collected using scatterometry overlay (SCOL) techniques associated with multiple cells of an overlay target may generally be separated into multiple components, where a first set of the components (referred to herein as a K signal) depends on the actual values of overlay at the location of an overlay target while a second set of the components (referred to herein as a G signal) does not. Rather, the G signal depends on physical properties of the overlay target design and relate to a sensitivity of the target to overlay variations. For this reason, this G signal is referred to herein as a sensitivity metric.

It is noted that an SCOL measurement at a particular location on the sample requires both the K signal and the G signal. For example, an overlay measurement (OVL) may be calculated using Equation 4 above. However, since the G signal (e.g., the sensitivity metric) does not depend directly on the actual overlay at a particular location of an overlay target, the G signal may be obtained from another source and thus need not be measured at every overlay target. As a result, the number of cells required for an overlay target to obtain an overlay measurement may be reduced when the G signal is obtained from another source, which may beneficially decrease measurement times and increase measurement throughput across the sample. Continuing the illustration of first-order SCOL techniques, a single-cell overlay target may be used when the G signal is obtained from another source.

It is further contemplated herein that the sensitivity metrics (e.g., the G signals) relate to physical attributes of the overlay target design. As a result, variations of these sensitivity metrics across a sample may relate to variations of the physical attributes of the overlay targets across the wafer, which typically occurs over length scales much greater than overlay variations. For example, overlay variations may vary significantly within each lithographic exposure field, whereas the physical attributes of the overlay targets (and thus the sensitivity metrics) may vary relatively slowly across several fields. Sensitivity metrics measured at one location may thus be relevant to multiple targets within a field or potentially between fields.

Although Equations 1-4 are directed to first-order scatterometry overlay, where each cell includes a different intentional shift, it is noted that the system and method of the present disclosure is not limited to first-order scatterometry overlay. For example, the system and method of the present disclosure may be used with zero-order scatterometry overlay.

Figure 4:
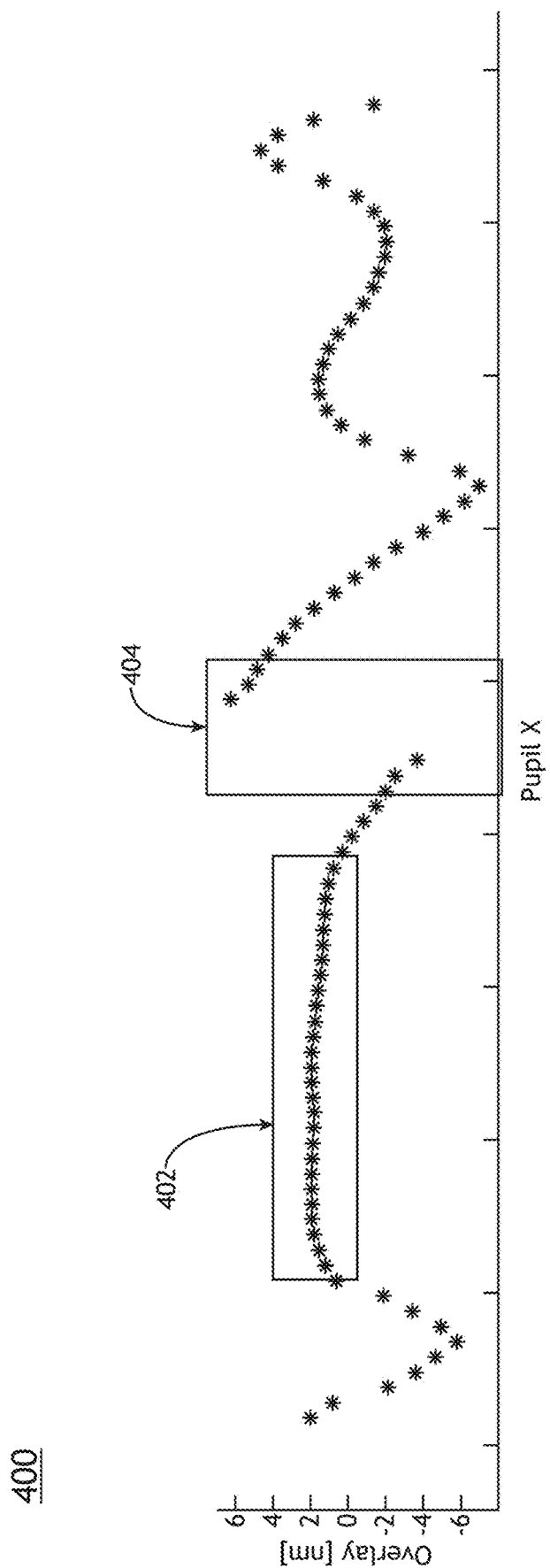
FIG. 4 is a plot of the full pupil landscape, in accordance with one or more embodiments of the present disclosure.

FIG. 4 is a plot depicting a full, pupil landscape, in accordance with one or more embodiments of the present disclosure.

In embodiments, a full, local pupil landscape 400 (as shown in FIG. 4) may be obtained. For example, a pupil image of each cell may be obtained to generate the landscape 400. For instance, the broadband pupil data of each pupil image may be sliced along the wavelength direction (e.g., the various wavelengths of the broadband illumination).

In embodiments, the landscape 400 may include a "green zone" 402 (or region of stability 402), where the region of stability 402 corresponds to a region where the sensitivity to overlay process variations is stable (e.g., a region of insensitivity of the overlay measurement to overlay process variations). For instance, as shown in FIG. 4, the green zone 402 may be shown as a plateau (e.g., the plateau on the left side of the graph in FIG. 4).

In embodiments, the landscape 400 may include a resonance region 404, where the resonance region 404 corresponds to a region where the sensitivity to process variations is large.

Figure 5A:
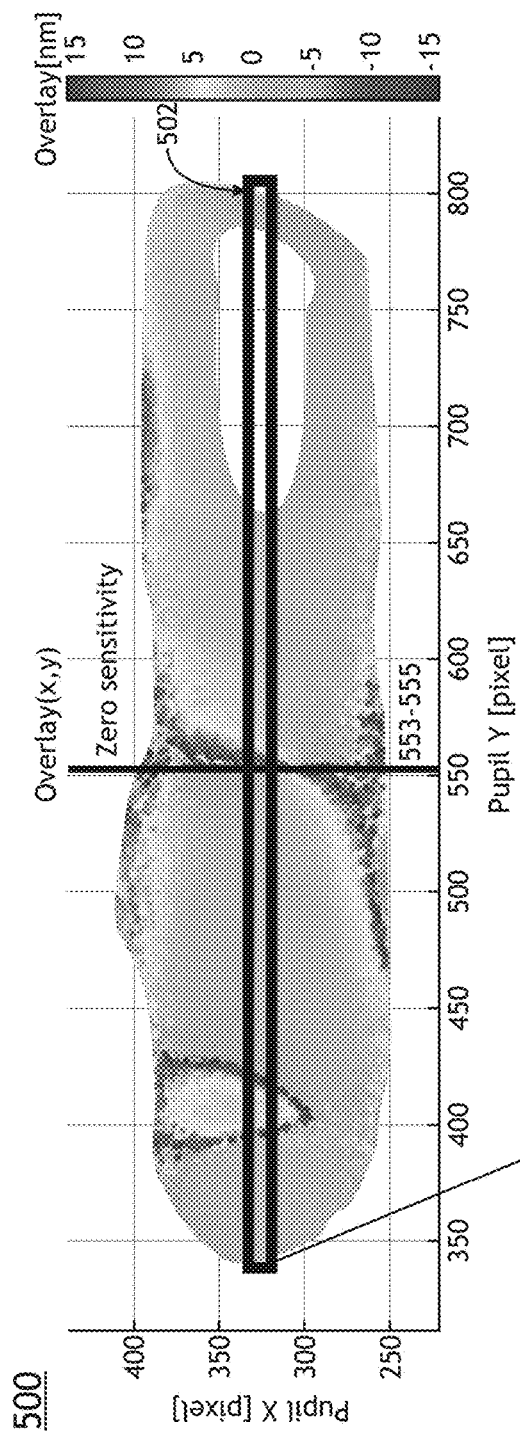
FIG. 5A is a plot depicting overlay, in accordance with one or more embodiments of the present disclosure.
Figure 5B:
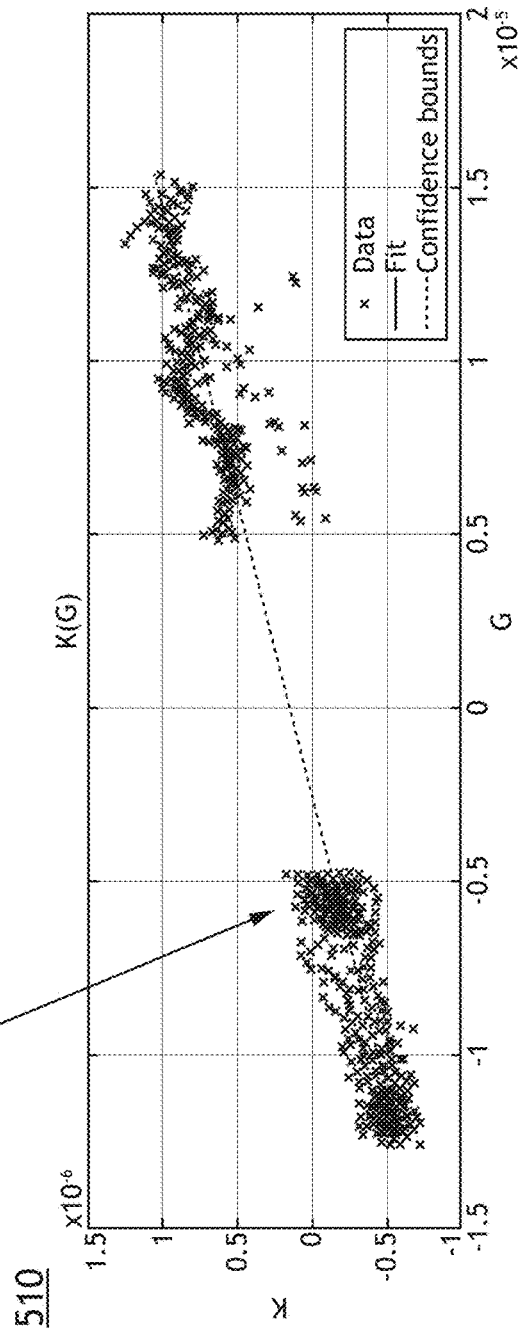
FIG. 5B is a plot depicting overlay, in accordance with one or more embodiments of the present disclosure.

FIGS. 5A-5D are plots 500-530 depicting per-pixel overlay, or overlay obtained using a multi-wavelength technique, in accordance with one or more embodiments of the present disclosure. FIG. 5A depicts a plot 500 depicting the overlay per pixel in the pupil, in accordance with one or more embodiments of the present disclosure. FIG. 5B depicts a plot 510 depicting a KG plot (whose slope is proportional to the overlay) with points corresponding to the pixels in the longitudinal slice depicted in FIG. 5A, in accordance with one or more embodiments of the present disclosure. FIG. 5C depicts a plot 520 depicting the overlay per pixel in the pupil, in accordance with one or more embodiments of the present disclosure. FIG. 5D depicts a plot 530 depicting a KG plot (whose slope is proportional to the overlay) generated by slicing and binning the pupil data traverse to the wavelength direction, where the regions 522 are as illustrated in FIG. 5C, in accordance with one or more embodiments of the present disclosure.

In embodiments, the broadband pupil data may be used in multi-wavelength algorithm to enable recipe-free, ultra-robust measurement. For example, multiple wavelengths within an identified "green zone" 402 may be used to obtain an overlay measurement.

Referring to FIGS. 5A-5B, in some embodiments, for example, the pupil data may be sliced parallel to the wavelength direction to obtain an overlay measurement. For example, FIG. 5A depicts the plot 500 including a region 502 produced from bins parallel to the wavelength direction. In embodiments, multiple wavelengths within the region 502 may be used to obtain an overlay measurement. For example, as shown in FIG. 5B, a slope of the straight line (best fit line) may be used to determine an overlay measurement, in accordance with Equations 3-4 shown and described above.

Referring to FIGS. 5C-5D, in some embodiments, for example, the pupil data may be sliced traverse to the wavelength direction to obtain an overlay measurement. For example, FIG. 5C depicts the plot 520 including a region 522 produced from bins traverse to the wavelength direction. In embodiments, multiple regions like 522 (which may be chosen to overlap) may be used to obtain an overlay measurement. For example, as shown in FIG. 5D, a slope of the straight line (best fit line) may be used to determine an overlay measurement, in accordance with Equations 3-4 shown and described above.

Figure 6:
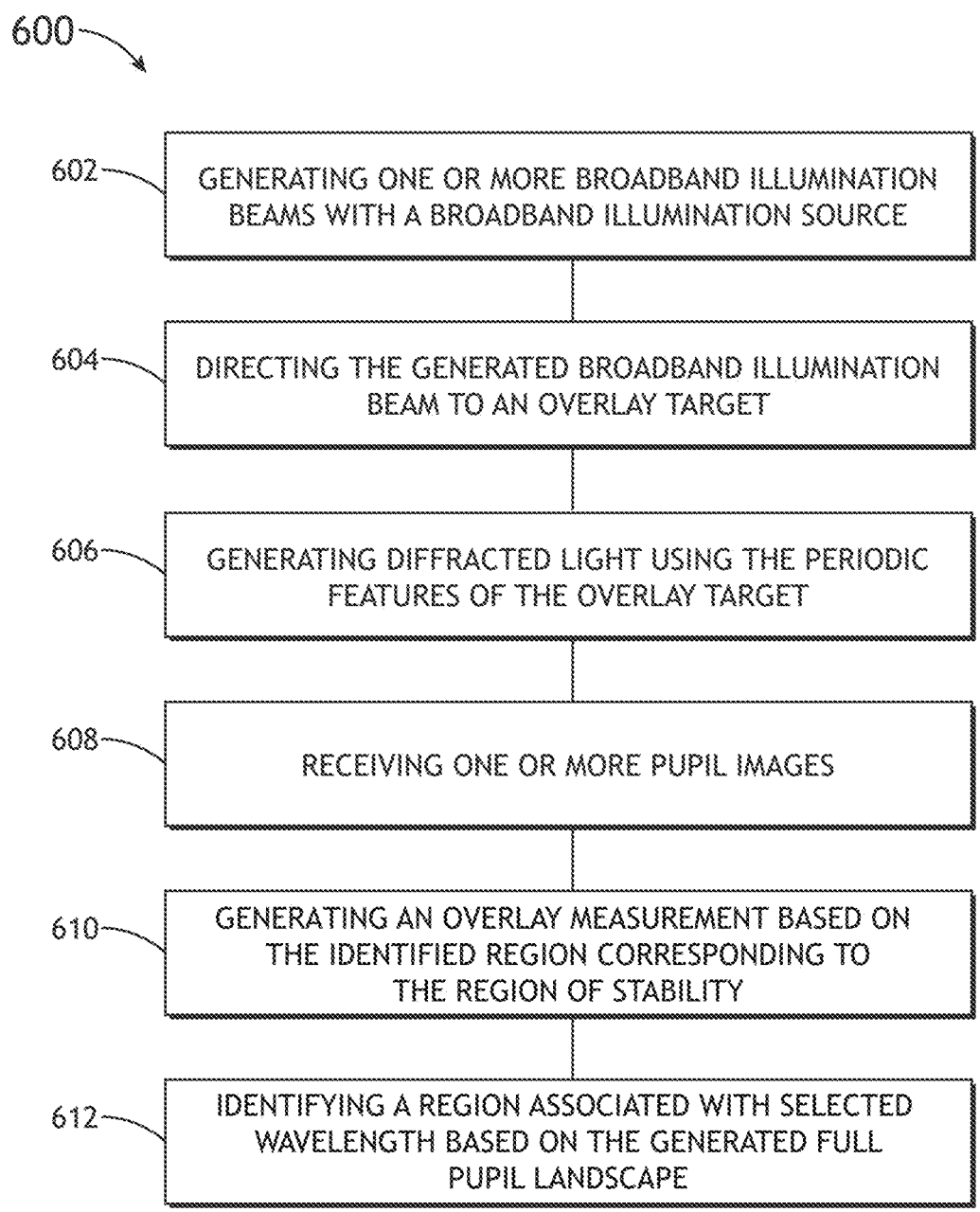
FIG. 6 is a flowchart depicting a method for generating overlay measurements using a broadband illumination source, in accordance with one or more embodiments of the present disclosure.

FIG. 6 is a flowchart depicting a method 600 for taking overlay measurements using a broadband illumination source, in accordance with one or more embodiments of the present disclosure. Applicant notes that the embodiments and enabling technologies described previously herein in the context of the overlay metrology system 100 it should be interpreted to extend to the method 600. It is further noted, however, that the method 600 is not limited to the architecture of the overlay metrology system 100.

In embodiments, the method 600 includes a step 602 of generating one or more broadband illumination beams with one or more broadband illumination sources.

In embodiments, the method 600 includes a step 604 of directing the generated one or more broadband illumination beams to an overlay target on a sample when implementing a metrology recipe.

In embodiments, the method 600 includes a step 606 of generating diffracted light using the periodic features of the overlay target. For example, the periodic features of the overlay target may act as a diffraction grating to generate the diffracted light by separating the broadband illumination beams into a plurality of wavelengths.

In embodiments, the method 600 includes a step 608 of receiving a pupil image from one or more detectors located at a pupil plane. For example, the one or more detectors may be configured to generate a pupil image of the overlay target when the overlay target is illuminated with the one or more broadband illumination beams from the one or more broadband illumination sources, where a distribution of light in the pupil plane in accordance with the metrology recipe includes zero-order illumination lobes and first-order diffraction lobes from the illumination from the illumination source and a spectra of the first-order diffraction lobes are spatially dispersed in the pupil plane (as shown in FIGS. 3A-3C).

In embodiments, the method 600 includes a step 610 of generating an overlay measurement of the sample based on selected portions of the pupil images corresponding to selected wavelengths of the spectrum of the first-order diffraction lobes.

In embodiments, the method 600 includes a step 612 of identifying a region associated with the selected wavelengths. For example, the identified region may correspond to a region of stability, where the region of stability corresponds to the region of stability of sensitivity of the overlay process variations.

Referring again to FIG. 1A, additional components of the overlay metrology tool 102 are described in greater detail, in accordance with one or more embodiments of the present disclosure.

In embodiments, the overlay metrology system 100 includes a controller 108. The controller 108 may include one or more processors 110 and/or a memory medium 112 (e.g., memory 112).

The controller 108 may include one or more processors 110 configured to execute program instructions maintained on a memory medium 112, or memory. In this regard, the one or more processors 110 of the controller 108 may execute any of the various process steps described throughout the present disclosure. Further, the controller 108 may be communicatively coupled to the overlay metrology tool 102 or any component therein.

The one or more processors 110 of a controller 108 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 110 may include any device configured to execute algorithms and/or instructions (e.g., program instructions stored in memory). In embodiments, the one or more processors 110 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 108 or, alternatively, multiple controllers. Additionally, the controller 108 may include one or more controllers housed in a common housing or within multiple housings. In this way, any controller or combination of controllers may be separately packaged as a module suitable for integration into the overlay metrology system 100.

The memory medium 112 may include any storage medium known in the art suitable for storing program instructions executable by the associated one or more processors 110. For example, the memory medium 112 may include a non-transitory memory medium. By way of another example, the memory medium 112 may include, but is not limited to, a read-only memory (ROM), a random-access memory (RAM), a magnetic or optical memory device (e.g., disk), a magnetic tape, a solid-state drive and the like. It is further noted that memory medium 112 may be housed in a common controller housing with the one or more processors 110. In embodiments, the memory medium 112 may be located remotely with respect to the physical location of the one or more processors 110 and controller 108. For instance, the one or more processors 110 of controller 108 may access a remote memory (e.g., server), accessible through a network (e.g., internet, intranet, and the like).

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
    an illumination sub-system comprising:
        one or more broadband illumination sources configured to generate one or more broadband illumination beams; and
        one or more illumination optics configured to direct the one or more broadband illumination beams to an overlay target on a sample when implementing a metrology recipe, wherein the overlay target in accordance with the metrology recipe includes one or more cells having periodic features formed as overlapping grating structures;
    a collection sub-system comprising:
        a detector located at a pupil plane, wherein the detector generates one or more pupil images of the one or more cells of the overlay target based on illumination from the one or more broadband illumination beams, wherein a distribution of light in the pupil plane in accordance with the metrology recipe includes first-order diffraction lobes from the one or more broadband illumination beams, wherein spectra of the first-order diffraction lobes are spatially dispersed in the pupil plane; and one or more collection optics configured to direct at least the first-order diffraction to the detector; and
a controller communicatively coupled to the detector, the controller including one or more processors configured to execute program instructions causing the one or more processors to:
receive the one or more pupil images of the one or more cells from the detector;
generate an overlay measurement of the sample based on selected portions of the one or more pupil images corresponding to selected wavelengths of the spectra of the first-order diffraction lobes;
slice the received one or more pupil images; and
generate, via a multi-wavelength algorithm, an additional overlay measurement of the sample based on selected portions of the sliced one or more pupil images corresponding to selected wavelengths of the spectra of first-order diffraction lobes.

2. The overlay metrology system of claim 1, wherein the detector generates a first pupil image of a first cell of the overlay target and a second pupil image of a second cell of the overlay target.

3. The overlay metrology system of claim 1, wherein the generate an overlay measurement of the sample based on the selected portions of the one or more pupil images corresponding to the selected wavelengths of the spectra of the first-order diffraction lobes further comprises:
identifying a region associated with the selected wavelengths, wherein the identified region corresponds to a region of stability, where the region of stability corresponds to a region of insensitivity of the overlay measurement to the overlay process variations.

4. The overlay metrology system of claim 1, wherein the one or more broadband illumination sources comprise a rotated quadrupole illumination source providing oblique illumination beams along two orthogonal directions in the pupil plane.

5. The overlay metrology system of claim 1, wherein the one or more processors are further configured to:
store the generated overlay measurements in memory when implementing the metrology recipe; and
adjust one or more process parameters based on the stored generated full pupil landscape.

6. The overlay metrology system of claim 1, wherein the one or more processors are further configured to:
store the generated overlay measurements in memory when implementing the metrology recipe; and
adjust one or more recipe parameters based on the stored generated full pupil landscape.

7. The overlay metrology system of claim 1, wherein the detector includes a charge-coupled device or a complementary metal oxide semiconductor detector.

8. The overlay metrology system of claim 1, wherein the sample includes a substrate.

9. The overlay metrology system of claim 8, wherein the sample includes a wafer.

10. An overlay metrology system comprising:
a controller communicatively coupled to a detector, the controller including one or more processors configured to execute program instructions causing the one or more processors to:
receive one or more pupil images of one or more cells of an overlay target from the detector, the one or more pupil images generated using one or more broadband illumination beams from one or more broadband illumination sources;
generate an overlay measurement of a sample based on selected portions of the one or more pupil images corresponding to selected wavelengths of a spectra of first-order diffraction lobes;
slice the received one or more pupil images; and
generate, via a multi-wavelength algorithm, an additional overlay measurement of the sample based on selected portions of the sliced one or more pupil images corresponding to selected wavelengths of the spectra of first-order diffraction lobes.

11. The overlay metrology system of claim 10, wherein the generate an overlay measurement of the sample based on the selected portions of the one or more pupil images corresponding to the selected wavelengths of the spectra of first-order diffraction lobes further comprises:
identifying a region associated with the selected wavelengths, wherein the identified region corresponds to a region of stability, where the region of stability corresponds to a region of insensitivity of the overlay measurement to the overlay process variations.

12. The overlay metrology system of claim 10, further comprising:
an illumination sub-system comprising:
the one or more broadband illumination sources configured to generate the one or more broadband illumination beams; and
one or more illumination optics configured to direct the one or more broadband illumination beams to the overlay target on the sample when implementing a metrology recipe, wherein the overlay target in accordance with the metrology recipe includes the one or more cells having periodic features formed as overlapping grating structures, wherein the periodic features of the overlay target act as a diffraction grating to generate diffracted light by separating the one or more broadband illumination beams into a plurality of wavelengths.

13. The overlay metrology system of claim 12, wherein the one or more broadband illumination sources comprise a rotated quadrupole illumination source providing oblique illumination beams along two orthogonal directions in a pupil plane.

14. The overlay metrology system of claim 10, further comprising:
a collection sub-system comprising:
the detector is located at a pupil plane, wherein the detector generates one or more pupil images of the one or more cells of the overlay target based on illumination with the one or more broadband illumination beams, wherein a distribution of light in a pupil plane in accordance with the metrology recipe includes first-order diffraction lobes from the one or more broadband illumination beams, wherein spectra of the first-order diffraction lobes are spatially dispersed in the pupil plane; and
one or more collection optics configured to direct at least the first- order diffraction lobes to the detector.

15. The overlay metrology system of claim 14, wherein the detector includes a charge-coupled device or a complementary metal oxide semiconductor detector.

16. The overlay metrology system of claim 10, wherein the one or more processors are further configured to:
store the generated overlay measurements in memory when implementing the metrology recipe; and
adjust one or more process parameters based on the stored generated full pupil landscape.

17. The overlay metrology system of claim 10, wherein the one or more processors are further configured to:
  store the generated overlay measurements in memory when implementing the metrology recipe; and
  adjust one or more recipe parameters based on the stored generated full pupil landscape.

18. The overlay metrology system of claim 10, wherein the sample includes a substrate.

19. The overlay metrology system of claim 18, wherein the sample includes a wafer.

20. A method comprising:
  generating one or more broadband illumination beams with one or more broadband illumination sources;
  directing the generated one or more broadband illumination beams to an overlay target on a sample when implementing a metrology recipe, wherein the overlay target in accordance with the metrology recipe includes one or more cells having periodic features formed as overlapping grating structures;
  generating diffracted light using the periodic features of the overlay target, wherein the periodic features of the overlay target act as a diffraction grating to generate the diffracted light by separating the broadband illumination beam into a plurality of wavelengths;
  generating one or more pupil images of one or more cells of the overlay target using a detector located at a pupil plane based on illumination with the one or more broadband illumination beams, wherein a distribution of light in the pupil plane in accordance with the metrology recipe includes first-order diffraction lobes, wherein spectra of the first-order diffraction lobes are spatially dispersed in the pupil plane;
  generating an overlay measurement of the sample based on selected portions of the one or more pupil images corresponding to selected wavelengths of the spectra of the first-order diffraction lobes;
  slice the received one or more pupil images; and
  generating, via a multi-wavelength algorithm, an additional overlay measurement of the sample based on selected portions of the sliced one or more pupil images corresponding to selected wavelengths of the spectra of first-order diffraction lobes.

\* \* \* \* \*